United States Patent
Paterson

(10) Patent No.: US 6,898,754 B2
(45) Date of Patent: May 24, 2005

(54) ERROR DETECTION FOR DATA STORAGE AND TRANSMISSION

(75) Inventor: Kenneth Graham Paterson, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 379 days.

(21) Appl. No.: 09/828,188

(22) Filed: Apr. 9, 2001

(65) Prior Publication Data

US 2001/0037484 A1 Nov. 1, 2001

(30) Foreign Application Priority Data

Apr. 10, 2000 (EP) .............................................. 00303023

(51) Int. Cl.[7] .......................................... H03M 13/00
(52) U.S. Cl. ...................................... 714/784; 714/755
(58) Field of Search ................................. 714/781, 784

(56) References Cited

U.S. PATENT DOCUMENTS

| 4,151,510 A | 4/1979 | Howell et al. ........... 340/146.1 |
| 4,413,339 A | * 11/1983 | Riggle et al. ............... 714/765 |
| 4,782,490 A | * 11/1988 | Tenengolts .................. 714/756 |
| 5,465,260 A | 11/1995 | Zook .......................... 714/752 |
| 5,822,337 A | * 10/1998 | Zook et al. ................. 714/785 |
| 5,872,799 A | * 2/1999 | Lee et al. ................... 714/755 |

FOREIGN PATENT DOCUMENTS

| EP | A-291167 | 11/1988 | ........... G11B/20/18 |
| EP | A-407101 | 1/1991 | ........... G11B/20/18 |
| EP | A-497593 | 8/1992 | ........... G11B/20/18 |

* cited by examiner

*Primary Examiner*—Guy J. Lamarre
*Assistant Examiner*—Esaw Abraham

(57) ABSTRACT

A check sum calculation on data coded with a Reed-Solomon error correcting code is performed by applying a byte based polynomial remaindering process to data bytes. The polynomial is $X^2+X\alpha^2+\alpha$, over GF $(2^8)$, where $\alpha$ is the primitive element GF $(2^8)$ used to define redundancy coding for individual data groups. The roots of the polynomial used in the polynomial remaindering process differ from the roots of a generator polynomial of the Reed-Solomon error correcting code. The polynomial remaindering process is performed with a sub function mask containing the same mask function as used in defining redundancy coding for a data group or groups. The data group or groups are redundance coded using a Reed-Solomon code over GF $(2^8)$.

15 Claims, 12 Drawing Sheets $D_0, D_1, D_2, D_3, \ldots\ldots\ldots D_n$ $0 \leq D_i \leq 255$ DDS-4 Checksum $= 16 \text{ least significant bits of } \sum_{i=0}^{n} D_i$ Fig. 7
(Prior Art)

·α on a a = a7, a6, a5, a4, a3, a2, a1, a0 a' = a6, a5, a4, a3, a2, a1, a0, O

If a7 = 1 then a'= a' XOR 00011101

Output = a'

ERROR DETECTION FOR DATA STORAGE AND TRANSMISSION

FIELD OF THE INVENTION

The present invention relates to the field of data handling, especially data transmission and data storage, and particularly, to a method and apparatus for detection of errors in sets of data.

BACKGROUND TO THE INVENTION

Conventional digital data storage (DDS) format devices provide reliable storage and retrieval of large amounts of digital data. Such devices are defined in ISO/IEEC Standard 10777:1991E.

In a DDS read/write mechanism, as defined in the ISO/IEEC Standard 10777:1991E, data is recorded on an elongate tape data storage medium coated with a magnetic coating. A rotating drum carries a plurality of read heads and a plurality of write heads. The elongate band of magnetic tape is passed around the rotating drum, resulting in a plurality of physical data tracks written in parallel across the elongate band of magnetic tape between opposite edges of the tape.

Referring to FIG. 1 herein, there is shown schematically a layout of a tape data storage cartridge in relation to a tape drive mechanism according to the known DDS-1 to DDS-4 formats, in which an elongate band of tape is contained within a removable tape cartridge 100. The tape cartridge is inserted between a pair of guides of a tape drive mechanism to locate the cartridge in the mechanism. A rotating read/write head 101 comprises first and second read heads and first and second write heads situated at substantially equidistant points around a circumference of the rotating head. The head rotates on top of a substantially cylindrical metallic plinth 102. A main central axis of a cylinder formed by the outer surfaces of the drum and the plinth is directed offset from a line normal to a plane of a base plate 103, so that the effect is that as the band of tape traverses around part of the circumference of the cylindrical head plinth, the rotating heads describe a path diagonally across a width of the tape in successive passes of the heads past the tape. The read/write head rotates at a speed of approximately 11,400 revs per minute.

Referring to FIG. 2 herein there is shown schematically a tape path of the elongate magnetic tape data storage medium 201 as it is drawn past the rotating drum containing the read and write heads. The tape data storage medium 201 is wound onto a feed reel 202 and a take up reel 203 which are within the removable tape cartridge 100. During normal operation, the magnetic tape 201 is wound from the feed-reel 202 on to the take-up reel 203. The path of the magnetic tape 201 is constrained by a plurality of rollers and tape guides 204–208. Additional tape guides 104, 105 determine the relative positions of the rotating drum 101, the read and write heads 210–213 and the tape data storage medium 201. The feed reel 202 and tape up reel 203 are driven by electric motors to maintain a correct tension in the magnetic tape 201 past the head.

Referring to FIG. 3 herein, there is illustrated schematically the orientation of the magnetic tape 201 with respect to the rotating drum 202. The tape 201 is drawn past the rotating head at a relatively slow tape speed of the order of a few centimeters per second. However, the rotating drum 101 on which the read and write heads are mounted, typically rotates at a few thousand revolutions per minute, so the relative speed of the read and write heads to the drum is of magnitudes of order greater than the absolute tape speed. During a write operation, the write heads record a sequence of tracks diagonally across the elongate magnetic tape 201. The width of such tracks is typically of the order of 6.8 $\mu$m. A plurality of data stripes 300 are written in parallel to each other across the width of the tape by the rotating write heads. In a read operation, the read heads trace along the plurality of stripes to read individual physical tracks.

The prior art formats DDS-1, DDS-2 and DDS-3 used an exclusive (XOR) based check sum. However, this was ineffective because a C2 mis-correction will often always give the same XOR based check sum as correct data.

The prior art DDS-4 format used a more effective arithmetic sum. However, this arithmetic sum has a significant chance of giving the same check sum if a mis-correction occurs.

Specific implementations according to the present invention aim to provide a new check sum which is fast, simple to implement and offers the theoretical maximum error correction detection performance which one would expect for a two byte check sum.

SUMMARY OF THE INVENTION

According to a first aspect of the present invention there is provided a method of reading data coded with a Reed-Solomon error correcting code, said method comprising the steps of:

reading said data; and performing a check sum calculation on said data;

wherein said check sum calculation includes applying a byte based polynomial remaindering process to the bytes of said data, the polynomial used in said polynomial remaindering process being primitive over $GF(2^8)$; and the roots of the polynomial used in said polynomial remaindering process are different to the roots of a generator polynomial of said Reed-Solomon error correcting code.

Preferably, said process uses arithmetic over $GF(2^8)$.

By selecting the polynomial in this way there will be detected with a probability 1 the C1, C2 mis-corrects which are restricted to lie in user data bytes and which have the minimum possible Hamming weight for a mis-correction.

Said check sum calculation may operate with a probability of failing to detect a random C1, C2 mis-correct error of 1 in $2^{16}$.

Preferably the polynomial used in said polynomial remaindering process is $X^2 + X\alpha^2 + \alpha$.

Preferably, said polynomial remaindering process is implemented using a sub function which has the same effect on bytes as multiplying by the field element $\alpha$ used in the parity checks in C1, C2 correction.

This sub function, whose action on a data byte a is denoted a·$\alpha$, is determined by:

inputting said byte of data into an 8 bit shift register;

reading a most significant bit of said byte;

shifting said byte of data by one bit to obtain a shifted byte value;

setting a least significant bit of said shifted byte to value 0; and if said most significant bit has a value 1, performing an exclusive OR of said shifted byte with a binary value 29.

The invention includes a method of decoding C1, C2 error correction coded data, said method comprising the steps of:

performing C1, C2 correction on individual ones of a plurality of groups of said C1, C2 data;

if errors in C1, C2 corrections are detected, then performing C3 error correction on a plurality of said groups of data;

performing a check sum calculation on said C3 corrected data by arranging said C1, C2 data in a 2-dimensional matrix comprising a plurality of columns, wherein each column contains a said data group of C1, C2 corrected data; and applying a check sum algorithm along columns of said 2-dimensional matrix, wherein said check sum algorithm includes applying a byte based polynomial remaindering process to each said column where the polynomial used in said process is primitive over $GF(2^8)$.

In the best mode the check sum algorithm fails to detect a random C1, C2 mis-correct error with a probability of only 1 in $2^{16}$.

The invention includes a digital data storage device capable of reading a magnetic tape data storage medium comprising a plurality of data tracks written in a width of said tape in a direction transverse to a main length of said tape, said data storage device comprising a read channel capable of implementing a method as described above.

In the specific implementation herein, data retrieved from the tape data storage medium contains errors introduced by noise. The data on the tape is encoded with three layers of error correction denoted C1, C2 and C3. C1 and C2 error corrections cover individual tracks, and C3 error correction covers groups of tracks. Additionally, a check sum is calculated on user data before it is written to the tape and is stored elsewhere on the tape. Once the track has been recovered, a track is C1 corrected and then C2 corrected. It is then checked against the check sums that no C1, C2 mis-corrections have occurred. The corrected data is then passed on to C3 correction. C3 correction is much more effective if the information that a mis-corrected track has occurred is entered into the C3 correction stage. If the check sum at the end of the C2 correction does not detect the mis-correction, and there is more than one track in error in a track group, then it is possible that C3 correction will introduce more errors, which could be passed back as incorrect data to a user. Once C3 correction has been applied, the check sums are again checked.

The choice of polynomial also gives the property of detecting common C1, C2 mis-corrects in user data.

The fact that the check sum uses a polynomial of degree 2 which is primitive over $GF(2^8)$ means that for random errors of other types, the probability of failing to detect an error is 1 in $2^{16}$.

Because the check sum uses a primitive polynomial this gives the extra property that errors introduced due to C3 mis-correction can be detected, such that any single byte error and most double byte errors in a column of a data frame due to C3 mis-correction are detected.

A 16 bit quantity is detected as a check sum value and a probability of failing to detect mis-correct patterns for a random mis-correct is 1 in $2^{16}$.

According to a second aspect of the present invention there is provided a method of reading redundancy coded data coded with a Reed-Solomon error correcting code, said method comprising the steps of:

reading a group of said coded data;

performing an error correction on said coded data group, to produce a corrected data group; and performing a check sum calculation on said error corrected data group;

wherein said check sum calculation includes applying a byte based polynomial remaindering process to the bytes of said corrected data group, the polynomial used in said polynomial remaindering process being primitive over $GF(2^8)$; and the roots of the polynomial used in said polynomial remaindering process are different to the roots of a generator polynomial of said Reed-Solomon error correcting code.

According to a third aspect of the present invention, there is provided a method of reading redundancy coded data comprising the steps of:

reading a plurality of groups of coded data;

performing error correction on each of said individual data groups of coded data to produce a plurality of corrected data groups;

performing a first check sum calculation on each of said plurality of corrected data groups;

performing further error correction on said plurality of corrected data groups; and performing the same check sum calculations as previously performed on the individual corrected data groups;

wherein at least one of said check sum calculations includes applying a byte based polynomial remaindering process to the bytes of said corresponding respective corrected data groups; wherein the polynomial used in said polynomial remaindering process is primitive over $GF(2^8)$, the Galois field containing 256 elements; and roots of the polynomial used in said polynomial remaindering process are different to the roots of a generator polynomial of a Reed-Solomon error correcting code used in generating said redundancy coded data.

Said means for reading a group of data may operate to read a group of coded data;

said means for performing error correction operates to produce a corrected data group;

said means for performing a check sum calculation on said corrected data group may operate to apply a byte based polynomial remaindering process to the bytes of said corrected data group.

Preferably, the polynomial used in said polynomial remaindering process is primitive over $GF(2^8)$, the Galois field containing 256 elements.

Preferably the roots of cyclical redundancy code polynomial used in said polynomial remaindering process are different to the roots appearing in a generator polynomial of a Reed-Solomon correcting code.

The invention includes an apparatus for reading data coded with a Reed-Solomon error correcting code, said apparatus comprising:

a reader for reading data; and a check sum calculator for performing a check sum calculation on the data, wherein said check sum calculation includes applying a byte based polynomial remaindering process to the bytes of said data, wherein a polynomial used in said polynomial remaindering process is primitive over $GF(2^8)$; and the roots of a polynomial used in said polynomial remaindering process are different to the roots of a generator polynomial of said Reed-Solomon error correcting code.

The invention includes an apparatus for reading redundancy coded data coded with a Reed-Solomon error correcting code, said apparatus comprising:

a reader for reading data;

an error corrector for performing error correction on said data; and a check sum calculator for performing a checksum calculation on the data; wherein said reader operates to read a group of redundancy coded data;

said error corrector operates to produce corrected data;

said check sum calculator includes the application of a byte based polynomial remaindering process to the bytes of said corrected data group, wherein a polynomial used in said polynomial remaindering process is primitive over $GF(2^8)$; and the roots of a polynomial used in said polynomial remaindering process are different to the roots of a generator polynomial of said Reed-Solomon error correcting code.

The invention includes an apparatus for reading redundancy coded data, said apparatus comprising:

a reader for reading a plurality of groups of coded data;

a first error corrector for performing error correction on individual said data groups of coded data to produce a plurality of corrected data groups;

a first check sum calculator for performing a first check sum calculation on each of said plurality of corrected data groups;

a second error corrector for performing further error correction on the plurality of corrected data groups;

a second check sum calculator for performing the same check sum calculations as previously performed on the individual corrected data groups, wherein at least one of said check sum calculations includes applying a byte based polynomial remaindering process to the bytes of said corresponding respective corrected data groups, wherein a polynomial used in said polynomial remaindering process is primitive over $GF(2^8)$; and the roots of a polynomial used in said polynomial remaindering process are different to the roots of a generator polynomial of a Reed-Solomon error correcting code.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which:

FIG. 7 illustrates schematically a method of calculating a check sum value after C1, C2 correction according to the known DDS-4 format;

DETAILED DESCRIPTION OF FIGS. 4–13

There will now be described by way of example the best mode contemplated by the inventors for carrying out the invention. In the following description numerous specific details are set forth in order to provide a thorough understanding of the present invention. It will be apparent however, to one skilled in the art, that the present invention may be practiced without limitation to these specific details. In other instances, well known methods and structures have not been described in detail so as not to unnecessarily obscure the present invention.

Figure 1:
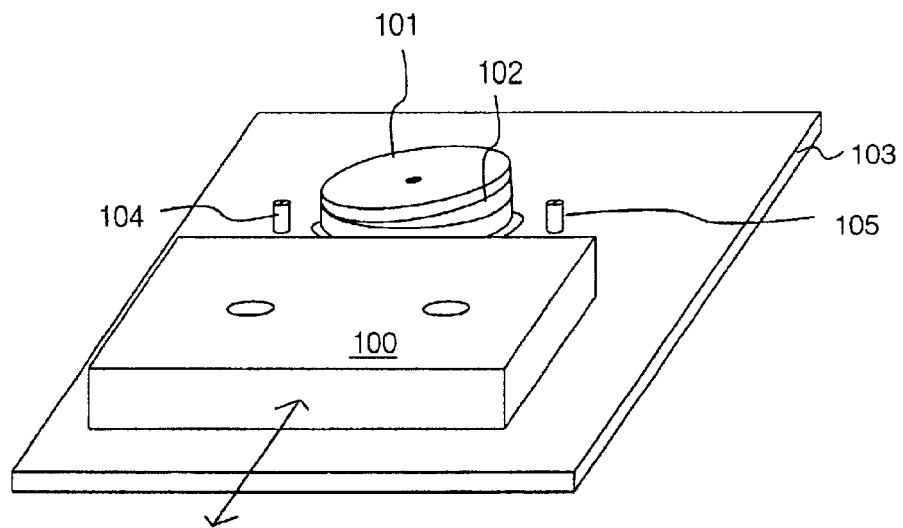
FIG. 1 illustrates schematically a prior art digital data storage (DDS) format data storage cassette and read/write head.
Figure 3:
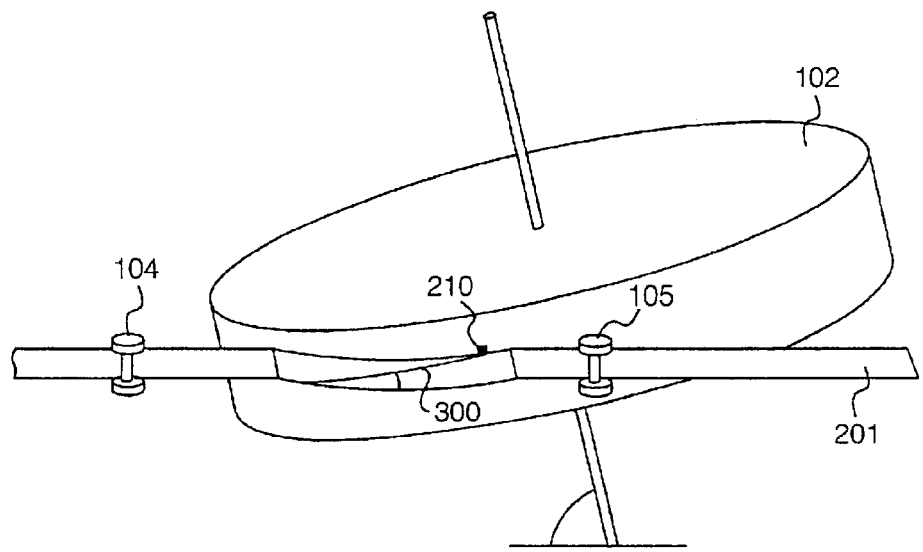
FIG. 3 illustrates schematically an orientation of a magnetic band of tape past a rotating read/write head of a known DDS format device, resulting in a plurality of written data stripes across a width of said magnetic tape.
Figure 2:
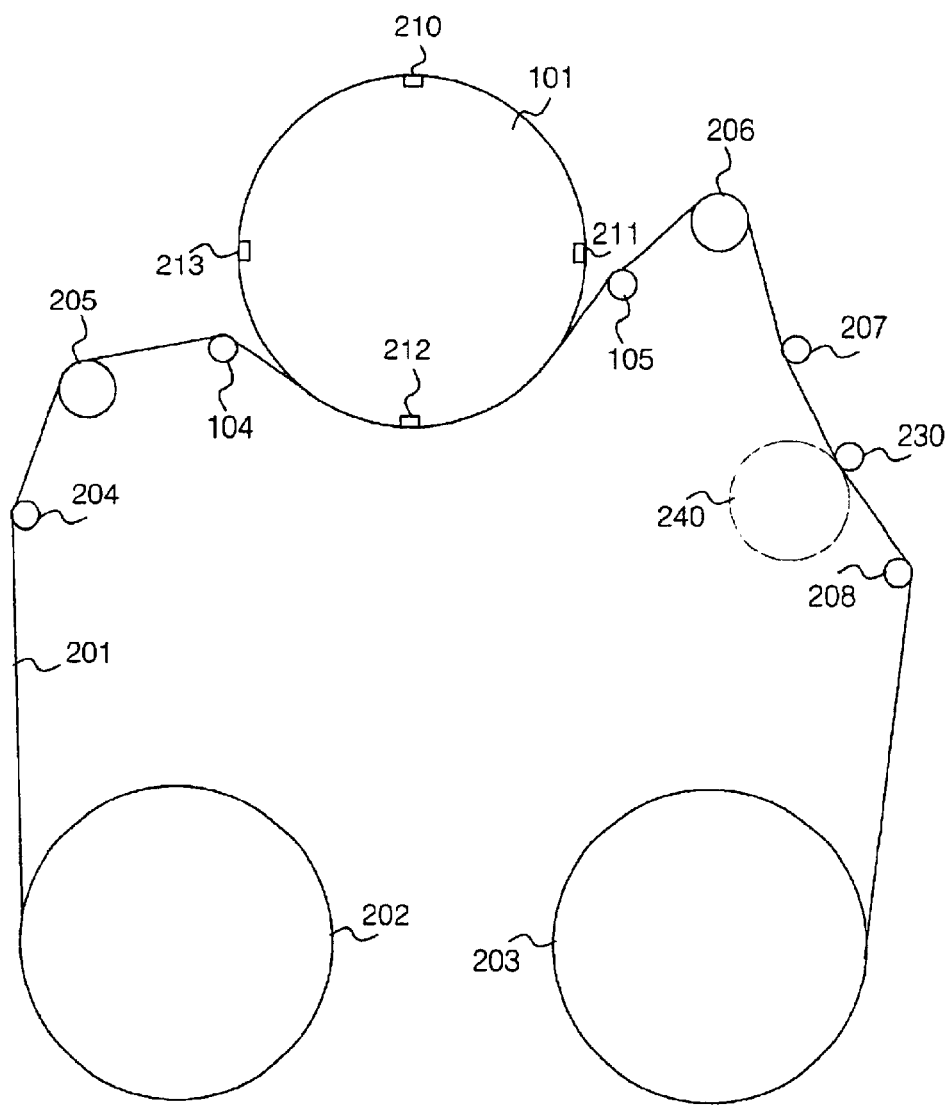
FIG. 2 illustrates schematically a drive mechanism for passing an elongate band of magnetic tape past a rotating read/write head according to a known DDS format.
Figure 4:
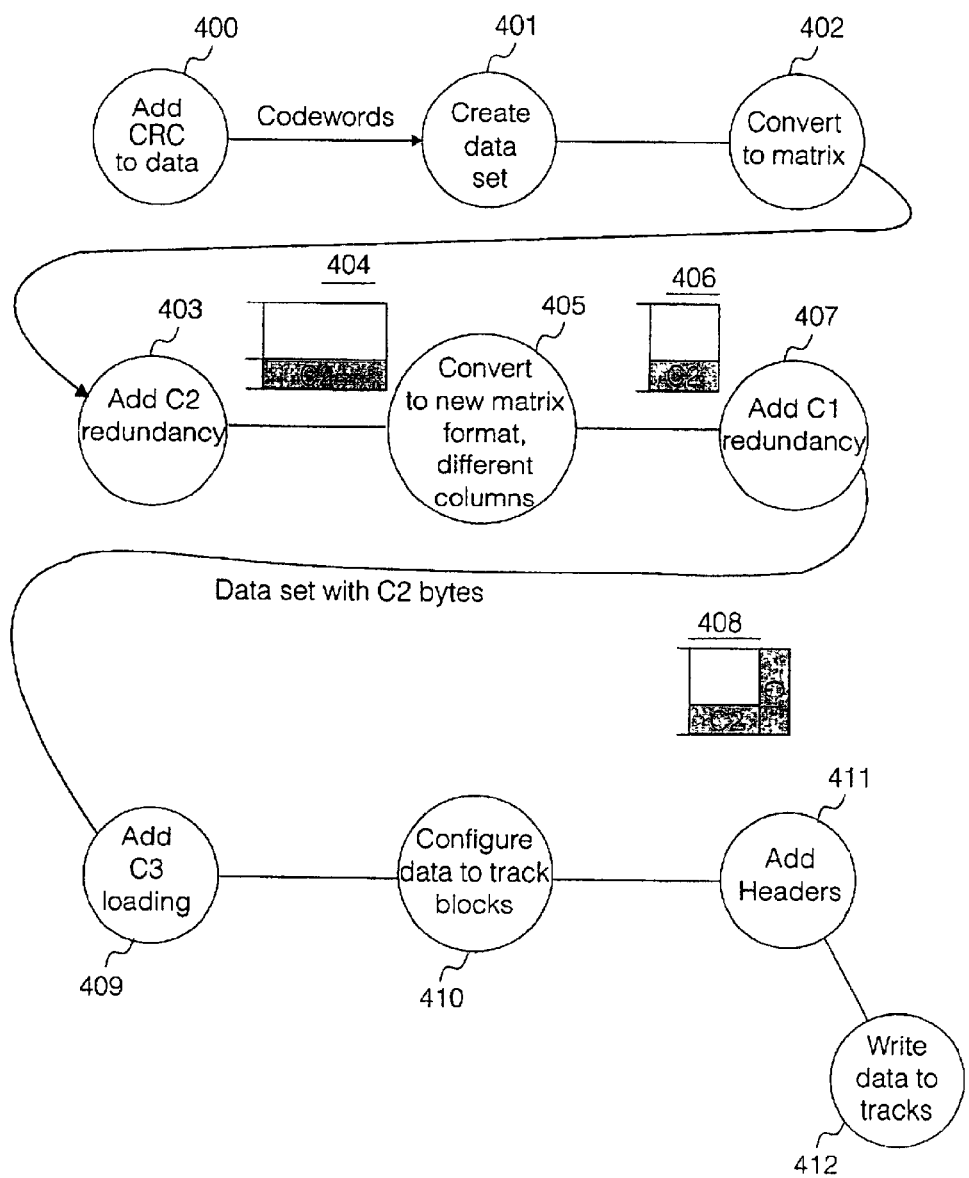
FIG. 4 illustrates schematically a prior art redundancy coding method for C1, C2 redundancy coding data in a known DDS-4 format.

Referring to FIG. 4 herein, there is illustrated schematically a coding process applied to data prior to writing in a known DDS-4 format digital data storage device. In step 400, a byte stream of user data is input into a buffer. The user data is partitioned into a set of records, each having a 4 byte check sum for protecting the record. The check sum may be checked when data is recovered during a read operation of the user data when the user data is recovered from a tape data storage medium. During such a read operation, inspection of the check sum is used to verify that the user data in the record has not been corrupted during storage on the tape. In step 401, the data stream is partitioned into a plurality of data sets. Each data set is of a fixed length and is created by grouping a predetermined number of user data code words, each code word comprising a predetermined number of bytes. In step 402, each user data set is converted into a two-dimensional matrix of rows and columns. In step 403, C2 redundancy coding is added to the data matrix resulting in a C2 coded data set 404. In step 405, the C2 coded data set is converted to a new matrix format 406 having a different number of rows and columns to the first C2 coded data set 404. In step 407, C1 redundancy coding is added to the second C2 coded data set 406 resulting in a C1 and C2 coded data set 408. C1 coding is added as a plurality of extra columns to the matrix. The data in the data set is protected by two orthogonal Reed-Solomon codes (the C1 and C2 codes). Each C1 codeword consists of a plurality of bytes of processed data followed by a plurality of bytes of redundancy symbols. C1 codewords are made up of two (62, 56, 7) codewords. C2 codewords are made up from three (32, 26, 7) codewords.

The C1/C2 coded data set 408 in the known DDS-4 format data storage devices has rows 96 bytes wide, having three C2 codewords per row.

In step 409, C3 coding is added over a plurality of C1, C2 coded data sets 408. In step 410, the plurality of data sets 408, being C3 coded, are configured into track blocks, for writing on tracks of the tape data storage medium. In step 411 headers are added to the track blocks prior to writing and in step 412 the data is written to the physical tracks on tape.

Figure 5:
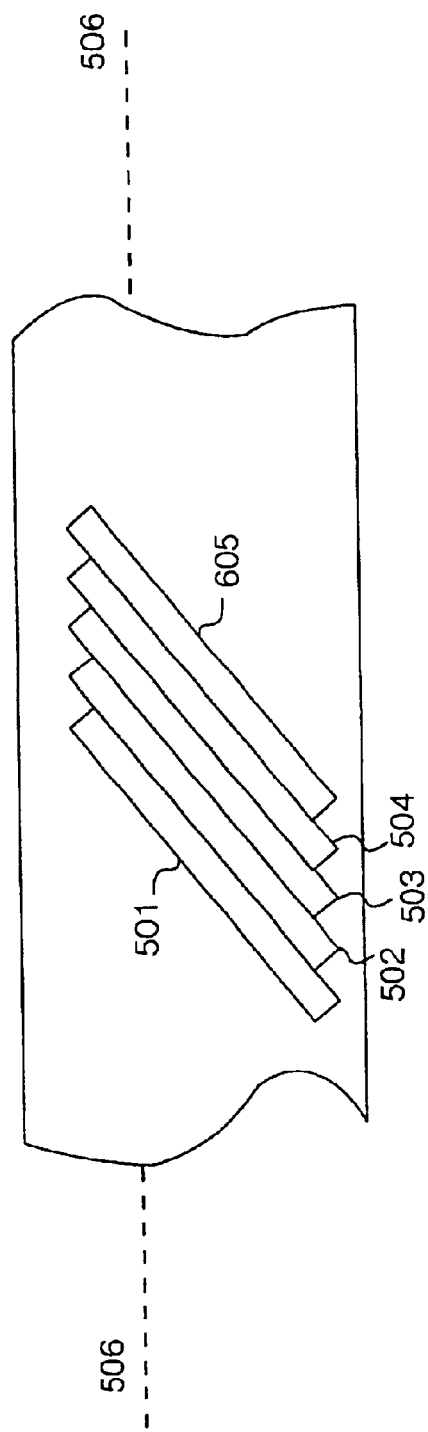
FIG. 5 illustrates schematically striping of individual tracks of data across a magnetic band of tape according to a known DDS format.

Referring to FIG. 5 herein, there is illustrated schematically a layout of physical tracks written to tape data storage medium in the DDS-4 format. Each pass of a write head across the band of tape causes a diagonally written physical track to be written across the tape. Since the head rotates at approximately 11,400 rpm, many such physical tracks arranged side by side and partially overlapping each other one on top of the other are written successively on the tape as the tape is drawn across the rotating head.

Prior art check sum algorithms, such as are known in communications systems, operate on a bit wise basis. That is to say, data streams are viewed as bit streams and data processing operations are carried out on a bit-by-bit basis, taking each individual bit one at a time. For example, calculation of a check sum may be made in a shift register of 16 bits length, where a bit stream is sequentially shifted along the shift register one bit at a time, whilst being operated on by a polynomial function. Conventional thinking is that optimum check sum algorithms operate on a bit wise basis.

However, in the DDS-3 and DDS-4 formats, check sums have been implemented on a byte wise basis. This has given a less than optimal solution in terms of error detection rates, but has been adopted due to convenience, since data is transported around devices in the DDS-3 and DDS-4 formats in quantities of bytes.

When decoding the prior art DDS-3 and DDS-4 formatted data, every once in a while, the C2 and C1 decoding fails to correct a data error or introduces a new error in which situation we refer to C1, C2 mis-correct. Data errors may be introduced at any stage of data processing prior to writing the data to the tape, or data may be corrupted during storage on the tape, or data may be incorrectly read from the tape, giving rise to errors. When errors do occur, they may be corrected by the C1 and C2 error correction algorithms.

Figure 6:
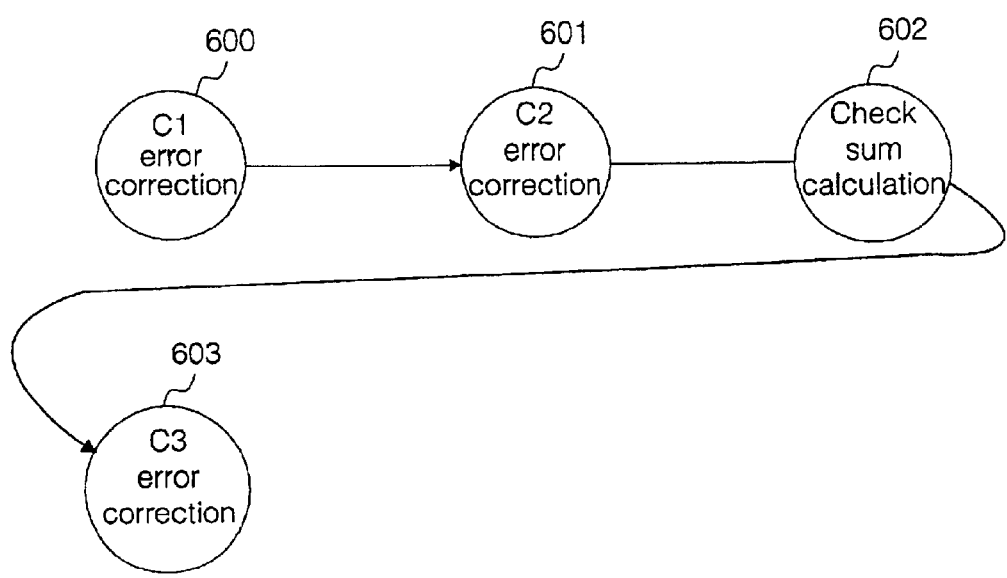
FIG. 6 illustrates schematically processes of a known decoding system including error correction according to a DDS-4 format for applying C1, C2 and C3 error correction with a single check sum step after C1 and C2 error correction.

Referring to FIG. 6 herein, there is illustrated the prior art signal processing steps for error correction in the known DDS-3 and DDS-4 formats. In step 600, C1 error correction is applied to the data read from a data storage medium. In step 601, C2 error correction is applied to the C1 error corrected data. Every once in a while, the C1 and C2 error correction fails, so that errors in the read data remain uncorrected, or new errors are introduced Such errors are detected in step 602 by a check sum calculation step. C1 and C2 error correction corrects errors within a C1, C2 coded data set. If the check sum calculations in step 603 detect that, after C1 and C2 correction, there are still errors in a data set, then C3 error correction is applied in step 604, which attempts to rectify the errors in the data set from redundancy coded data spread across other data sets in a C3 coded data set group. However, in the DDS-4 format the check sum calculations 602 may not always detect errors which have failed to be corrected by the C1 or C2 error correction or introduced by that correction process.

Referring to FIG. 7 herein, there is illustrated schematically application of a DDS-4 check sum to a C1, C2 error corrected user data set. The corrected user data set is treated as a sequence of bytes of data $D_0, D_1, \ldots D_n$, where n is approximately 6,000. Each byte $D_i$ of the data stream is interpreted as a number between 0 and 255. A DDS-4 check sum is calculated as the least significant 16 bits of the sum of all such values for each byte of the data stream. If the value gets bigger than the 65,535, then the data overflows, and the least significant 16 bits are taken as the check sum value.

Specific implementations of the present invention aim to:

Detect a specific class of common types of error which remains uncorrected by the C1 and C2 error correction.

Give improved performance over prior art DDS-3 and DDS-4 check sum error detection for other less common types of error which are uncorrected by C1 and C2 error corrections.

Theoretically, a well-designed check sum having 16 bits should fail only once in $2^{16}$ applications of the check sum to random data, that is to say once in every 65,536 errors. For 65,535 out of 65,536 errors, a well-designed 16 bit check sum should detect the error. However, in the DDS-4 check sum, the rate of failure to detect errors is as high as 1 in 600. In the DDS-3 format, the check sum failed with a probability of 1 (that is to say all the time) to detect common mis-correction errors introduced by the C1, C2 error correction. Using a conventional check sum, the mis-corrected user data, having already undergone C1 and C2 correction can give rise to a check sum which is the same as a check sum for a perfectly corrected user data set.

In prior art DDS-3 products, the check sum often failed, because, by coincidence, the check sum used in DDS-3 was already one of the parity checks used in C1 and C2 correction. Hence it did not detect any errors which were not already detected and corrected by the C1 and C2 error correction processes. Thus, any errors which passed through the C1 and C2 error correction without being detected by the parity checks inherent in those processes, also passed the DDS-3 check sum, because the check sum was the same as one of the parity checks in the C1, C2 processes.

In the prior art DDS-4 products, the check sum was changed from the DDS-3 check sum. However, this DDS-4 check sum gave rise to failure to detect common errors of approximately 1 in 600, with approx. 599 out of every 600 errors being detected.

Figure 8:
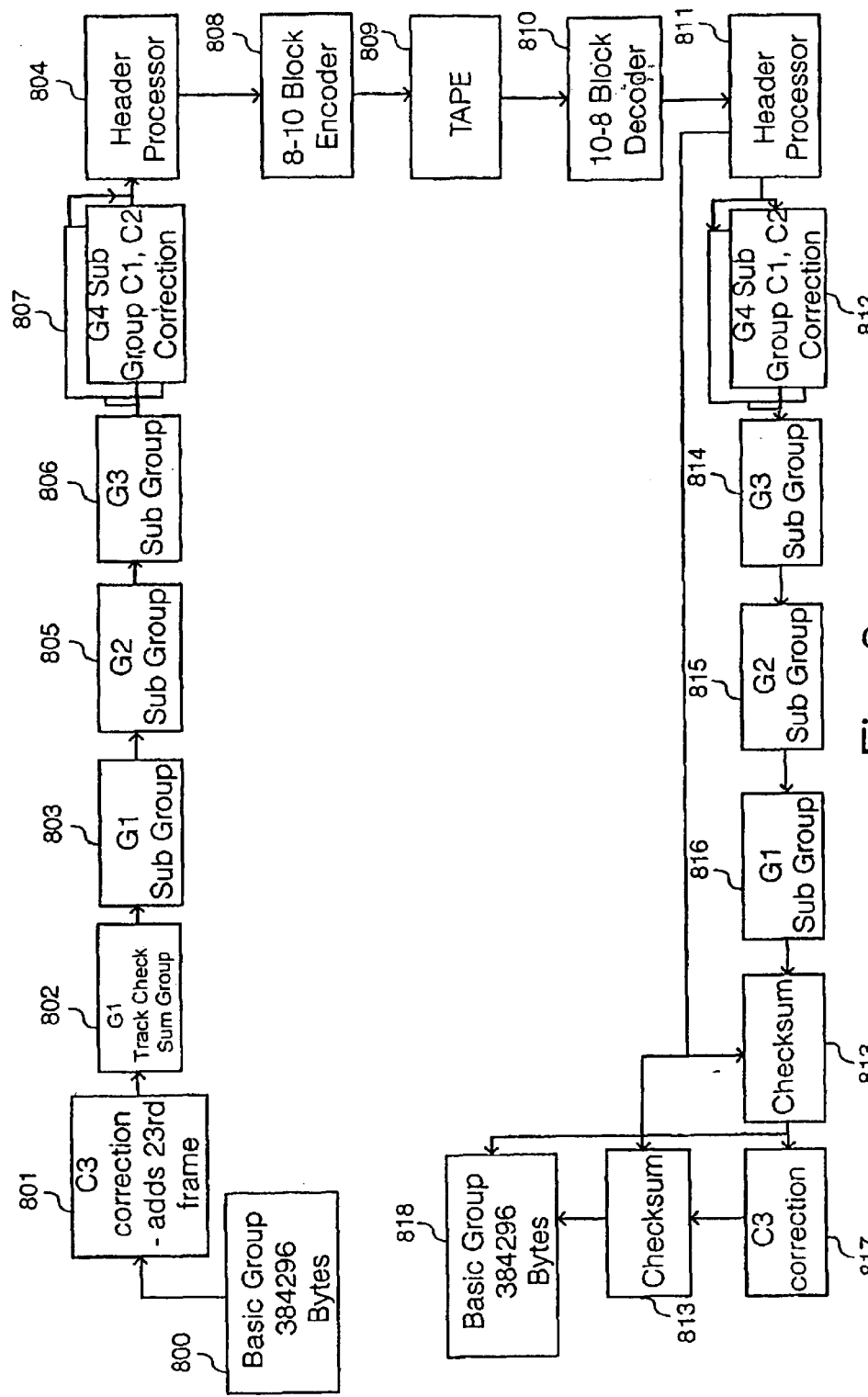
FIG. 8 illustrates schematically a write channel for encoding data and writing to tape and a read channel for reading data and decoding from a tape according to a specific implementation of the present invention.

Referring to FIG. 8 in the accompanying drawings, there is illustrated schematically a write channel of a data storage device for storing data in a tape data storage means, modified to provide a check sum system in accordance with the specific implementation of the present invention. A stream of user data for storage onto the tape is grouped into a plurality of basic groups, each of 384,296 bytes by a basic group module compiler, 800. C3 correction is added to every $23^{rd}$ frame by C3 encoder 801. A track check sum is generated by track check sum generator 802, to generate a check sum which is added to the group data. Once a basic group has been completed, it is split by a G1 sub-group processor 803 into a plurality of 22 G1 sub-groups, each having 17,468 bytes, numbered from 0 to 17,467. Each G1 sub-group has a running number in the range of from 1 to 22. An error correction code (ECC3) processor 804 derives data from each of the 22 G1 subgroups to form a $23^{rd}$ G1 subgroup. The error correction code C3 is a GF($2^8$) Reed-Solomon code. The error correction code C3 has the capability of correcting any two tracks which are bad in a recorded data group.

The bytes of each G1 subgroup are randomized by a G2 subgroup module 805. Byte numbering from $D_0$ to $D_{17,467}$ is retained. A G3 subgroup module 806 operates on the G2 subgroup so that each G2 subgroup of 17,468 bytes is arranged to group as $D_0$ to $D_{8733}$ over G2 subgroup in a first track (track A) of the G3 subgroup, and bytes $D_{8734}$ to $D_{17,647}$ in a second track (track B) of the G3 subgroup. The subgroups, having had headers appended to them by header processor 804 are then 8–10 block encoded by 8–10 block encoder 808, before writing to the tape data storage medium 809 in a physical layout as illustrated with reference to FIG. 6 herein, where data tracks are written across the width of the magnetic type.

In the read channel, the data stored on the tape data storage medium 809 is read by a magnetic head and amplified and equalized before being passed into a sequence detector. The detected signal is input into a 10-8 block decoder, 810 and then passed to a header processor 812, in which the headers of each data block are read for identification of data blocks. C1, C2 correction is applied in a G4 subgroup correction processor 812. G1, G2 and G3 subgroups are processed in corresponding G1, G2, G3 subgroup processors 816, 815, 814 respectively. Track check sum values are recovered by a track check sum retriever 813. Check sums are applied at two stages. Firstly, after C1, C2 correction 813, and secondly, after C3 correction 817. A basic group is output after error correction and detection at output 818.

Figure 9:
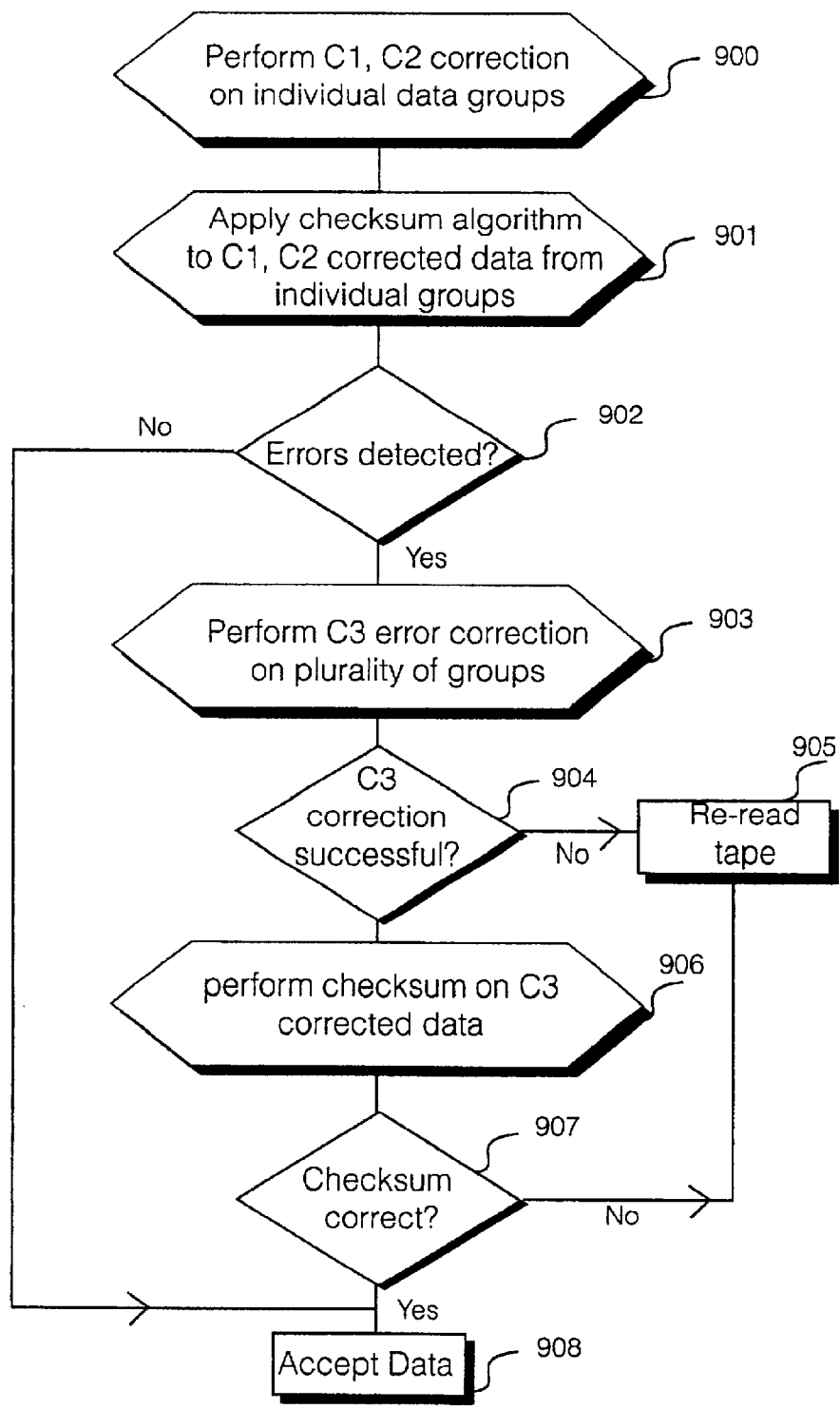
FIG. 9 illustrates schematically a method of decoding data in the read channel of a DDS device according to the specific implementation of the present invention.

Referring to FIG. 9 herein, there is illustrated schematically a specific method according to the best mode herein for applying error detection by means of a check sum algorithm during signal processing stages in a read channel of a digital data storage device. In step 900, C1 and C2 correction is performed on individual data groups read from the tape. In step 901, a check sum algorithm is applied to the C1, C2 corrected data of the individual data groups. If no errors are detected by the check sum algorithm in step 902, then the data is accepted in step 908. However, if errors are detected by the check sum algorithm in step 902, then in step 903 C3 error correction is performed on a plurality of groups. C3 error correction attempts to correct defects in individual data groups from redundancy encoded data present in other data groups. The C3 error correction may be able to correct errors in individual data groups. However, if the C3 error correction is unable to make such correction, then the tape is re-read in step 905. The decision on whether to re-read the tape is carried out within the C3 correction algorithm. If C3 correction is successfully completed in step 904, then in step 906, the check sum algorithm is again applied to the C3 corrected data. If the calculated check sum coincides with the pre-stored check sum read from the tape in step 907, then the data is accepted in step 908. However, if the check sum is not correct, then the data is re-read from the tape in step 905.

Figure 10:
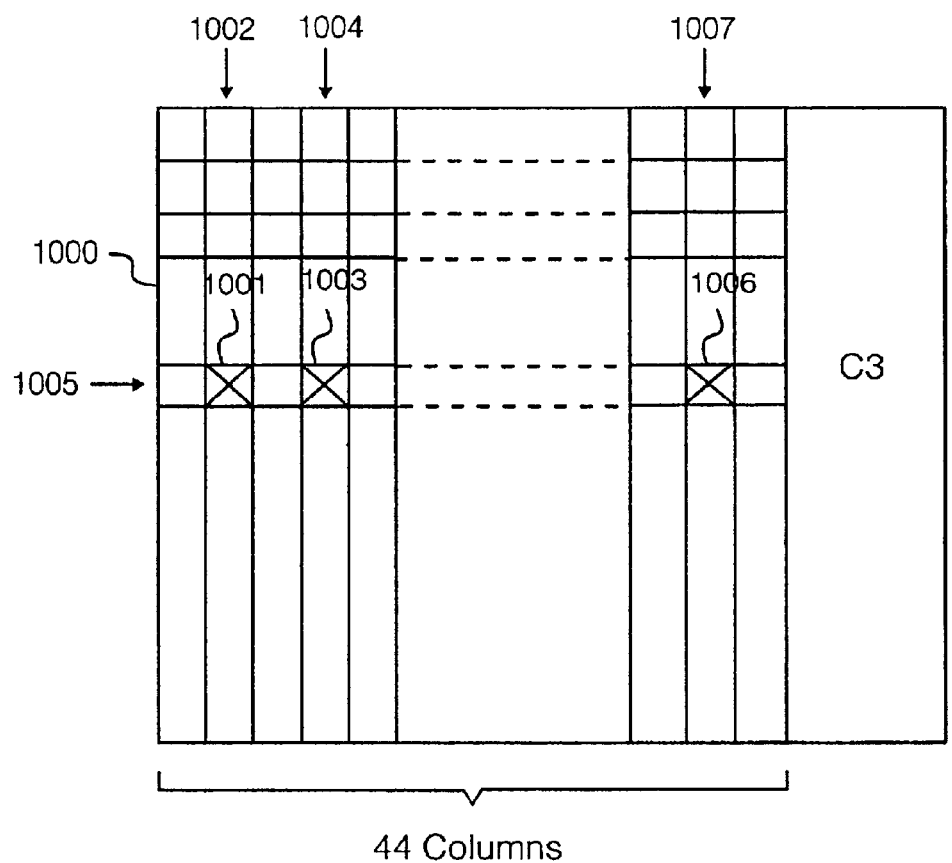
FIG. 10 illustrates schematically a data frame comprising a plurality of C1, C2 corrected user data groups, upon which C3 error correction is performed according to a specific implementation of the present invention.

Referring to FIG. 10 of the accompanying drawings, there is illustrated schematically a frame of data 1000 containing C3 error correction. The frame comprises a 2-dimensional array having 44 columns, each comprising a C1, C2 corrected data group. C3 coding exists as a plurality of additional columns in the frame. The C3 correction is applied by reading across rows of the data frame. The plurality of columns (data groups) may contain C1, C2 mis-corrects. The C3 correction both detects and corrects residual errors in a frame. Where the number of errors is greater than can be corrected by the C3 correction, the C3 correction directs re-reading of data from the tape.

C1, C2 correction can either leave original errors uncorrected, or can correct those errors, or can introduce further errors by a process of mis-correction.

There may occur a situation where a C1, C2 uncorrected error 1001 occurs in a first column 1002 corresponding to a first data group, and a second C1, C2 uncorrected error 1003 occurs in a second column 1004 corresponding to a second data group. Because the first and second C1, C2 uncorrected errors 1001, 1003 appear on a same row 1005 of the data frame, the C3 correction, which operates across the row, may mis-correct the row due to the high occurrence of errors after C1, C2 correction. Mis-correction of the row by the C3 correction may result in more errors being introduced. Such mis-corrections are very rare, but can occur.

Therefore, if a further error 1006 is introduced into a new column 1007, by C3 mis-correction, then there is an advantage in detecting this further error. This further error is always detected by operation of a check sum algorithm according to the best mode herein.

A check sum algorithm is implemented on the user data content (including C1, C2 correction) after each data frame 1000. After C3 correction, the same check sum calculation is applied across each column of the data frame in order to detect any mis-corrections which may have occurred by the C3 correction. Additionally, the second check sum as described herein has the property that if 2 errors are introduced by C3 mis-correction in a same column (that is to say in the same data group) or if two such errors occur in that column by any other process, then the check sum will detect these two errors in any one column with a probability of failure of 1 in 65,536.

Therefore, two common occurrences of residual errors still being extant in the data frame will almost always be detected by check sum detection after C3 correction, in which case the data can be re-read from the tape.

Figure 11:
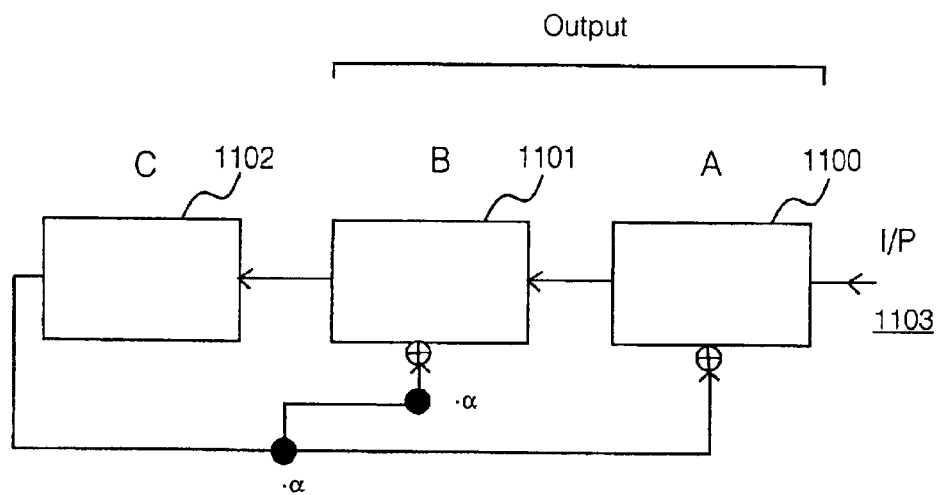
FIG. 11 illustrates schematically a hardware representation for applying an algorithm for calculating a check sum value according to a specific method of the present invention.

Referring to FIG. 11 herein, there is illustrated schematically a hardware equivalent for performing a check sum calculation process on each column of a data frame 1000. It will be appreciated by those skilled in the art that the hardware of FIG. 11 may be replaced by equivalent hardware implementations to perform a same function, or may be replaced by a data processor and/or computer plus computer program for carrying out a same function. In the best mode herein, the function represented by the hardware of FIG. 11 is implemented as an application specific integrated circuit (ASIC).

The check sum calculator of FIG. 11 gives a means of implementing the polynomial remaindering process previously mentioned herein. It comprises a shift register having first, second and third locations 1100, 1101, 1102, denoted A, B, C respectively each of length one byte. Data 1103 corresponding to each column of data frame 1000 is input into the register 1 byte at a time. The register is clocked 1 byte at a time for a data input comprising a byte stream $D_0$, $D_1$, $D_2$. The output is taken as a 16 bit value formed from bytes B and A after all the data bytes have been input into the register.

Figure 12:
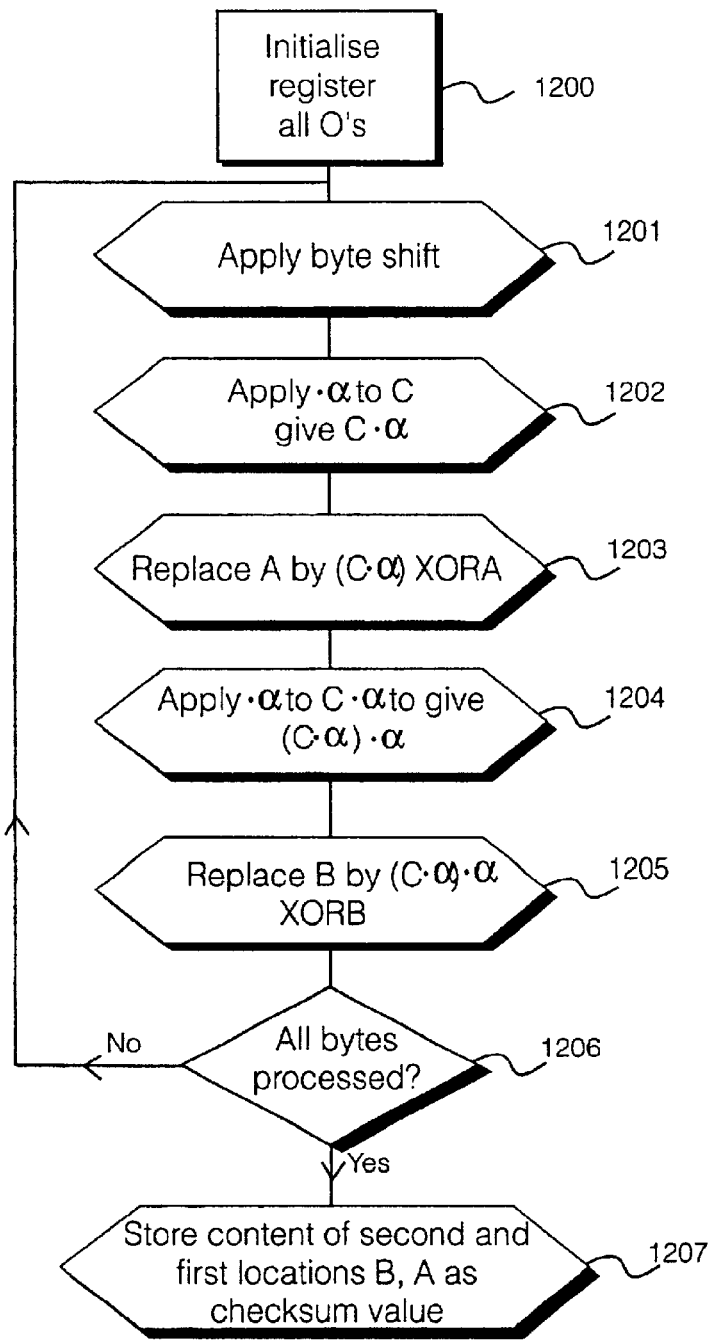
FIG. 12 illustrates schematically process steps for calculating a check sum value according to the specific method of the present invention.

Although, in FIG. 11 a 3 byte shift register implementation for performing the polynomial remaindering process is shown, a hardware shift register implementation, in the form of an application specific integrated circuit, can be produced where a two byte shift register is used Referring to FIG. 12, there is illustrated step wise operation of the shift register of FIG. 11 for processing a byte data stream corresponding to a single column of user data of data frame 1000. A single column of data comprises user data bytes $D_0, D_1, D_2 \ldots D_{11, 645}$. For each column, prior to entering the column of data bytes the register is initialized so that all locations are set initially to value 0 in step 1200. In step 1201, a byte shift is applied to the register so that a first byte $D_0$ enters the first location 1100. The remaining locations 1101, 1102 remain at value 0. A function ·α is applied to the output of the first location in step 1202 and in step 1203 there is applied an exclusive OR (XOR) of that value with the value stored in first location 1100. In step 1204, the function ·α is applied to the result of the function ·α on the content C of first location 1102. The resultant value is combined by an exclusive OR function with the content B of the second location 1101 in step 1205. In step 1206, it is checked whether all bytes of the column have been processed. If all bytes have not been processed, then the shift register is clocked to enter the next byte of the column sequence $D_i$ into the first location 1100. The content of first location 1100, that is the function ·α on A is shifted into the second location 1101. The previous content of the second location 1101, that is α applied to ·α on the content of content C of third location 1102 is shifted into the third location 1102 in step 1101. Steps 1102–1205 repeat. All bytes of the column sequence up to $D_{11, 645}$ are processed in this manner. The output of the device after this process is the content of the second and first locations B, A of the shift register (in step 1207).

Figure 13:
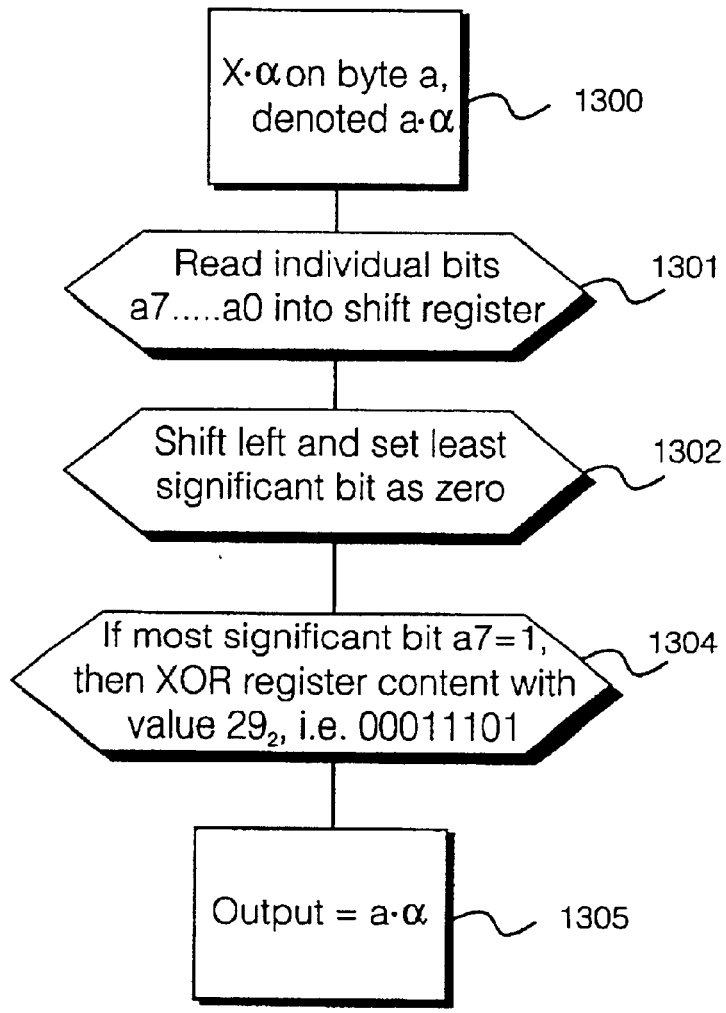
FIG. 13 illustrates schematically an algorithm for applying a function ·α on a byte of data for calculation of the check sum value according to the specific method of the present invention.

Referring to FIG. 13 herein, there is illustrated operation of the function ·α on a single byte a·α To obtain the function ·α on a 1300, denoted ·α in step 1301 the byte a is read as a plurality of 8 individual bits $a_7, a_6, a_5, a_4, a_3, a_2, a_1, a_0$ into a shift register. In step 1302, the shift register is shifted left, and the least significant bit of a shift register is set at 0, giving $a_6, a_5, a_4, a_3, a_2, a_1, a_0$. If the most significant bit $a_7$ had a value 1, then the left shifted content of the shift register is XOR'ed with a second mask function equivalent to binary value 29, i.e. 0,0,0,1,1,1,0,1 in step 1304. The result of the operations is an output a·α in step 1304.

The mask function binary 29 in the ·α sub function is selected due to its close relationship with the error correction codes C1, C2 and C3 This choice of the second mask value in combination with the choice of polynomial $X^2+X\alpha^2+\alpha$ means that the check sum has several properties as follows:

The check sum detects all C1, C2 mis-corrects, where the error pattern is restricted to lie on user data bytes and the error pattern has the minimum possible Hamming weight.

As a consequence of the shift register arrangement of FIG. 11, in combination with the mask value, gives the property that one or two new errors introduced into a C1, C2 data group can almost always be detected, for example if they are introduced by C3 mis-correction.

The shift register structure corresponds to a polynomial:

$$X^2+\alpha^2 X+\alpha$$

which is a degree 2 polynomial having co-efficients 1, $\alpha^2$ and α, where α is an algebraic expression which lends the polynomial the property of primitivity over $GF(2^8)$. This means that the check sum has the power to detect almost all errors in one or two positions in each column of the frame of FIG. 10. The expression is efficiently implemented in hardware, because the operation ·α only needs to be carried out in a small number of places. The powers of α used are relatively small, and yet the polynomial still has the property of primitivity and the power to detect C3 mis-corrects.

Roots of the cyclical redundancy check polynomial used in the polynomial remaindering process are not roots of a generator polynomial of the Reed-Solomon error correcting code.

The maximum error detecting capability is extracted when the roots of the polynomial used in the remaindering process are all different from the roots of the generator polynomial of the Reed-Solomon code. However, whilst not optimal, significant error detecting capability increase can be obtained when just one of the roots of the CRC polynomial is different from all the roots of the generator polynomial of the Reed-Solomon code.

In the present implementation, the polynomial remaindering process is applied to the corrected data, processing one byte at a time. The C1, C2 corrected and C3 corrected user data is clocked through the shift register in a byte wise manner, that is to say one byte at a time. This is significantly different from prior art algorithms which shift data though a register one bit at a time in a bit wise fashion.

In the prior art DDS-4 format, the check sum was restricted to being calculated on user data bytes only. Other bytes which are recorded on the tape, for example parity bytes and headers, do not have the check sum applied in DDS-4. In the best mode herein, the check sum is applied to the user data bytes only, and is not applied to the parity bytes, and other header information required from the tape by the read channel. For C1, C2 mis-correction errors occurring in the user data bytes, then a common form of mis-correction, which is a mis-correction of minimum possible Hamming weight, will always be detected with a probability of 1 by the check sum method according to the best mode herein.

Approximately 19% of this common C1, C2 mis-correction error occurs in the user data. Of this 19%, 100% of that common mis-correction is detected by the check sum according to the best mode herein. Of the remaining C1, C2 mis-correction errors, these errors may be spread between the parity and header bytes written to the physical tracks, and the user data. For this remaining set of C1, C2 mis-correction errors, the check sum method according to the best mode herein fails to detect those mis-corrections with a probability of only 1 in 65,536 (1 in $2^{16}$). Therefore, for 65,535 out of 65,536 times, the remaining mis-correction errors are detected.

What is claimed is:

1. A magnetic tape comprising multiple parallel diagonal tracks together storing (a) N data bytes divided into M sub groups, each of the subgroups having data bytes as well as C1 and C2 orthogonal redundancy coding bytes; and (b) a C3 error correcting sub group resulting from the M sub groups; each of the sub groups having P bytes; each pair of the parallel diagonal tracks together including one of the sub groups so that a first track of each diagonal track pair includes P/2 bytes of sub group i and a second track of each diagonal track pair includes the remaining P/2 bytes of sub group i, where i =1 . . . M; the error correcting sub group being in an additional pair of the parallel diagonal tracks A and B; the bytes in tracks A and B having values resulting from byte k of the 2M tracks being combined; track j including a pair of further check bytes derived in accordance with the polynomial $X^2+X\alpha^2+\alpha$, where α is the primitive element $GF(2^8)$, X=the value of the byte k of track j, j=1 . . . 2M,A,B and k=1 . . . P/12.

2. The tape as claimed in claim 1, wherein said polynomial is generated by using a sub function having a mask function, said sub function for the byte k of track j being derived by:

shifting each byte k of track j by one bit to obtain a shifted byte k value;

setting the least significant bit of each shifted byte k to value 0; and if the most significant bit of each byte k has a value 1, performing an exclusive OR of said shifted byte with the binary value 29.

3. The tape as claimed in claim 2, wherein M=22.

4. A method of reading bytes stored in diagonal tracks, the tracks including (a) 2M tracks each storing (i) data bytes and (ii) C1, C2 orthogonal redundancy coding bytes, and (b) tracks A, B each storing C3 error correction bytes coded with a Reed-Solomon error correcting code, said method comprising the steps of:

reading said bytes from the 2M tracks;

reading said bytes from tracks A, B; and performing a check sum calculation on said bytes;

wherein said check sum calculation includes processing the bytes in track j in accordance with the polynomial $X^2+X\alpha^2+\alpha$, where j=1 ... 2M,A,B, $\alpha$ is the primitive element $GF(2^8)$, X=the value of byte k in track j, j=1 ... 2M,A,B, and k=1 ... Q, Q=number of bytes in track j.

5. The method as claimed in claim wherein said polynomial is applied by using a sub function having a mask function, said sub function for the byte k of track j being derived by:

reading the most significant bit of byte k of track j;

shifting each byte k of track j by one bit to obtain a shifted byte value;

setting the least significant bit of each shifted byte to value 0; and if the most significant bit of each byte has a value 1, performing an exclusive OR of said shifted byte with the binary value 29.

6. The method as claimed in claim 5 wherein M=22.

7. An apparatus for performing the method of claim 6.

8. An apparatus for performing the method of claim 5.

9. An apparatus for performing the method of claim 4.

10. A method of writing data and error correcting bytes into multiple parallel diagonal tracks of a magnetic tape, the method comprising: dividing N data bytes into M sub groups, forming each of the subgroups so it has data bytes as well as C1 and C2 orthogonal redundancy coding bytes; and forming a C3 error correcting sub group from the M sub groups; each of the sub groups having P bytes; each pair of the parallel diagonal tracks together including one of the sub groups so that a first track of each diagonal track pair includes P/2 bytes of sub group i and a second track of each diagonal track pair includes the remaining P/2 bytes of sub group i, where i is 1 ... M; forming the error correcting sub group so it is in an additional pair of the parallel diagonal tracks A and B so the bytes in tracks A and B have values resulting from byte k of the 2M tracks being combined, track j including a pair of further check sum bytes derived in accordance with the polynomial $X^2+X\alpha^2+\alpha$, where $\alpha$ is the primitive element $GF(2^8)$, X=the value of byte k of track j, j=1 ... 2M,A,B and k=1 ... P/2.

11. The method as claimed in claim 10, wherein said polynomial is generated by using a sub function having a mask function, said sub function for the byte k of track j being derived by:

shifting each byte k of track j by one bit to obtain a shifted byte value;

setting the least significant bit of each shifted byte to value 0; and if the most significant bit of each byte has a value 1, performing an exclusive OR of said shifted byte with the binary value 29.

12. An apparatus for performing the method of claim 11.

13. The method as claimed in claim 11, wherein M=22.

14. An apparatus for performing the method of claim 13.

15. An apparatus for performing the method of claim 10.

* * * * *